(12) United States Patent
Prakash et al.

(10) Patent No.: US 12,260,927 B2
(45) Date of Patent: *Mar. 25, 2025

(54) DIE-BASED HIGH AND LOW PRIORITY ERROR QUEUES

(71) Applicant: Kioxia Corporation, Tokyo (JP)

(72) Inventors: Gyan Prakash, San Jose, CA (US); Vijay Sankar, San Jose, CA (US)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/862,006

(22) Filed: Jul. 11, 2022

(65) Prior Publication Data

US 2023/0030672 A1 Feb. 2, 2023

Related U.S. Application Data

(63) Continuation of application No. 17/022,848, filed on Sep. 16, 2020, now Pat. No. 11,417,410.

(51) Int. Cl.
| | |
|---|---|
| *G11C 29/40* | (2006.01) |
| *G06F 9/48* | (2006.01) |
| *G11C 29/12* | (2006.01) |
| *G11C 29/26* | (2006.01) |
| *G11C 29/42* | (2006.01) |
| *G11C 29/44* | (2006.01) |

(52) U.S. Cl.
CPC ............ *G11C 29/42* (2013.01); *G06F 9/4881* (2013.01); *G11C 29/1201* (2013.01); *G11C 29/26* (2013.01); *G11C 29/44* (2013.01)

(58) Field of Classification Search
CPC ..... G11C 29/42; G11C 29/1201; G11C 29/26; G11C 29/44; G11C 29/52; G06F 9/4881
See application file for complete search history.

(56) References Cited

U.S. PATENT DOCUMENTS

| | | | |
|---|---|---|---|
| 8,707,104 B1 | 4/2014 | Jean | |
| 9,432,298 B1 * | 8/2016 | Smith | ................. H04L 49/9057 |
| 11,194,643 B1 * | 12/2021 | Liang | .................... G06F 11/076 |
| 11,417,410 B2 * | 8/2022 | Prakash | ................. G11C 29/52 |
| 2013/0124932 A1 | 5/2013 | Schuh et al. | |
| 2016/0103732 A1 * | 4/2016 | Tuers | ..................... G11C 29/52 |
| | | | 714/764 |

(Continued)

*Primary Examiner* — Uyen Smet
(74) *Attorney, Agent, or Firm* — Foley & Lardner LLP

(57) ABSTRACT

A processor coupled to a NAND memory device comprising an n by m array of dies having n channels performs error recovery message scheduling and read error recovery on the dies by receiving indications of read errors responsive to attempted execution of a read command on a destination die and creates an error recovery message or instruction in response to the indication. The processor determines the destination die of the error recovery message and sends the error recovery message to a die queue based on the determined destination die. The n×m die queues can each be further divided into p priority queues, and error recovery messages are sent to the appropriate die priority queue based on a priority associated with the error recovery message. The processor fetches error recovery messages from a head of each die priority queue and performs read error recovery at the destination die.

19 Claims, 16 Drawing Sheets

(56) References Cited

U.S. PATENT DOCUMENTS

| | | | |
|---|---|---|---|
| 2016/0103733 A1* | 4/2016 | Camp | G06F 11/1048 |
| | | | 714/6.11 |
| 2017/0168892 A1* | 6/2017 | Roh | G06F 3/061 |
| 2018/0321844 A1* | 11/2018 | Benisty | G06F 13/1642 |
| 2019/0339902 A1* | 11/2019 | Yanes | G06F 3/0688 |
| 2020/0310911 A1* | 10/2020 | Fu | G06F 3/0679 |
| 2021/0026713 A1* | 1/2021 | Puttaswamy | G06F 9/546 |
| 2022/0091984 A1 | 3/2022 | Das et al. | |

* cited by examiner

| Error Recovery Queue | Channel | Bank |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | | |
| 17 | | |
| 18 | | |
| 19 | | |
| 20 | | |
| 21 | | |
| 22 | | |
| 23 | | |
| 24 | | |
| 25 | | |
| 26 | | |
| 27 | | |
| 28 | | |
| 29 | | |
| 30 | | |
| 31 | | |

FIG. 4A

| Error Recovery Queue | Channel | Bank |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | 0 | 4 |
| 17 | 1 | 4 |
| 18 | 2 | 4 |
| 19 | 3 | 4 |
| 20 | 0 | 5 |
| 21 | 1 | 5 |
| 22 | 2 | 5 |
| 23 | 3 | 5 |
| 24 | 0 | 6 |
| 25 | 1 | 6 |
| 26 | 2 | 6 |
| 27 | 3 | 6 |
| 28 | 0 | 7 |
| 29 | 1 | 7 |
| 30 | 2 | 7 |
| 31 | 3 | 7 |

| Error Recovery Queue | Channel | Bank |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | | |
| 17 | | |
| 18 | | |
| 19 | | |
| 20 | | |
| 21 | | |
| 22 | | |
| 23 | | |
| 24 | | |
| 25 | | |
| 26 | | |
| 27 | | |
| 28 | | |
| 29 | | |
| 30 | | |
| 31 | | |

FIG. 9B

| Error Recovery Queue | Channel | Bank |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | 0 | 4 |
| 17 | 1 | 4 |
| 18 | 2 | 4 |
| 19 | 3 | 4 |
| 20 | 0 | 5 |
| 21 | 1 | 5 |
| 22 | 2 | 5 |
| 23 | 3 | 5 |
| 24 | 0 | 6 |
| 25 | 1 | 6 |
| 26 | 2 | 6 |
| 27 | 3 | 6 |
| 28 | 0 | 7 |
| 29 | 1 | 7 |
| 30 | 2 | 7 |
| 31 | 3 | 7 |

FIG. 12A

| Error Recovery Queue | Channel | Bank |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | | |
| 17 | | |
| 18 | | |
| 19 | | |
| 20 | | |
| 21 | | |
| 22 | | |
| 23 | | |
| 24 | | |
| 25 | | |
| 26 | | |
| 27 | | |
| 28 | | |
| 29 | | |
| 30 | | |
| 31 | | |

FIG. 12B

| Error Recovery Queue | Channel | Bank |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | 0 | 4 |
| 17 | 1 | 4 |
| 18 | 2 | 4 |
| 19 | 3 | 4 |
| 20 | 0 | 5 |
| 21 | 1 | 5 |
| 22 | 2 | 5 |
| 23 | 3 | 5 |
| 24 | 0 | 6 |
| 25 | 1 | 6 |
| 26 | 2 | 6 |
| 27 | 3 | 6 |
| 28 | 0 | 7 |
| 29 | 1 | 7 |
| 30 | 2 | 7 |
| 31 | 3 | 7 |

… # DIE-BASED HIGH AND LOW PRIORITY ERROR QUEUES

CROSS-REFERENCE TO RELATED APPLICATIONS

This application is a continuation of U.S. application Ser. No. 17/022,848 filed on Sep. 16, 2020; the entire contents of which are incorporated herein by reference.

FIELD OF THE INVENTION

The present invention generally relates to systems and methods to schedule error recovery messages on a processor.

BACKGROUND OF THE INVENTION

In a memory system, such as a solid state drive, an array of memory devices is connected to a memory controller via a plurality of memory channels. A processor in the memory controller maintains a queue of memory commands for each channel and schedules commands for transmission to a memory device.

Conventional memory controller processors schedule memory commands in the queues according to a round-robin selection method, scheduling the command at the head of the selected queue for transmission to a memory device. When a read memory command fails to read data correctly, the processor attempts error correction. If this fails, conventionally the processor creates one or more new commands, placed in a single error recovery queue to attempt recovery of the data. A response to the original read command must wait until data recovery completes, which increases the latency of read commands which encounter failures. When many read errors occur in a short time period, a large number of error recovery commands will be added into a single queue to be handled in serial fashion, further increasing the latency of the read commands.

The conventional grouping of error recovery commands into a single queue also does not account for the different types and priorities of all read commands issued to the memory controller processor, including both host originated read commands and internal read commands created by the memory controller. For example, a host issued read command with strict latency requirements may be positioned after an internal read error recovery commands in the queue awaiting scheduling. These issues become more prominent and problematic as the wear on the memory device increases with age and the number of reported errors increases.

Accordingly, there is a long felt and unmet need for memory controllers to be capable of efficiently scheduling error recovery commands to memory devices.

BRIEF DESCRIPTION OF THE INVENTION

In an aspect, a processor is communicatively coupled to a NAND memory device having an n×m array of NAND memory dies having n channels, where each channel of the n channels is communicatively coupled to m NAND memory dies, and a method of scheduling error recovery instructions by the processor includes receiving an indication of a read error responsive to an attempted execution of a read command on a destination die of the n v m array of NAND memory dies. The method also includes creating an error recovery instruction in response to the indication of the read error, determining the destination die of the error recovery instruction, and sending the error recovery instruction to a die queue based on the destination die of the error recovery instruction.

In another aspect, a system for scheduling error recovery instructions at a processor includes a NAND memory device having an n×m array of NAND memory dies having n channels, where each channel of the n channels is communicatively coupled to m NAND memory dies and a processor communicatively coupled to the NAND memory device. The processor includes logic that processes read commands requesting data from the NAND memory device and error recovery instructions for execution on the NAND memory device and a die queue for each NAND memory die of the n×m array. The processor receives an indication of a read error responsive to an attempted execution of a read command on a destination die of the n×m array of NAND memory dies, creates an error recover instruction in response to the indication of the error, and determines the destination die of the error recovery instruction. The processor also sends the error recovery instruction to a die queue based on the destination die of the error recovery instruction.

BRIEF DESCRIPTION OF THE FIGURES

The foregoing and other objects and advantages will be apparent upon consideration of the following detailed description, taken in conjunction with the accompanying drawings, in which like reference characters refer to like parts throughout, and in which:

FIG. 4A shows a block diagram of a mapping of error recovery messages to a die-based queue for a 4-channel by 4-bank configuration;

FIG. 4B shows a block diagram of a mapping of error recovery messages to a die-based queue for a 4-channel by 8-bank configuration;

FIG. 9A shows a block diagram of a mapping of error recovery messages to a die-based queue for a 4-channel by 4-bank configuration for 2 channel IOD sets in a 4 channel IOD-enabled SSD die array;

FIG. 9B shows a block diagram of a mapping of error recovery messages to a die-based queue for a 4-channel by 8-bank configuration for an IOD-enabled SSD die array;

FIG. 12A shows a block diagram of a mapping of error recovery messages to a die-based queue for a 4-channel by 4-bank configuration of a 2 bank IO Stream-enabled SSD die array;

FIG. 12B shows a block diagram of a mapping of error recovery messages to a die-based queue for a 4-channel by 8-bank configuration of a 2 bank IO Stream-enabled SSD die array;

DETAILED DESCRIPTION OF THE INVENTION

To provide an overall understanding of the devices described herein, certain illustrative embodiments will be described. Although the embodiments and features described herein are specifically described for use in connection with a SSD having a controller, it will be understood that all the components and other features outlined below may be combined with one another in any suitable manner and may be adapted and applied to other types of SSD architectures requiring scheduling of various commands on die arrays.

Figure 1:
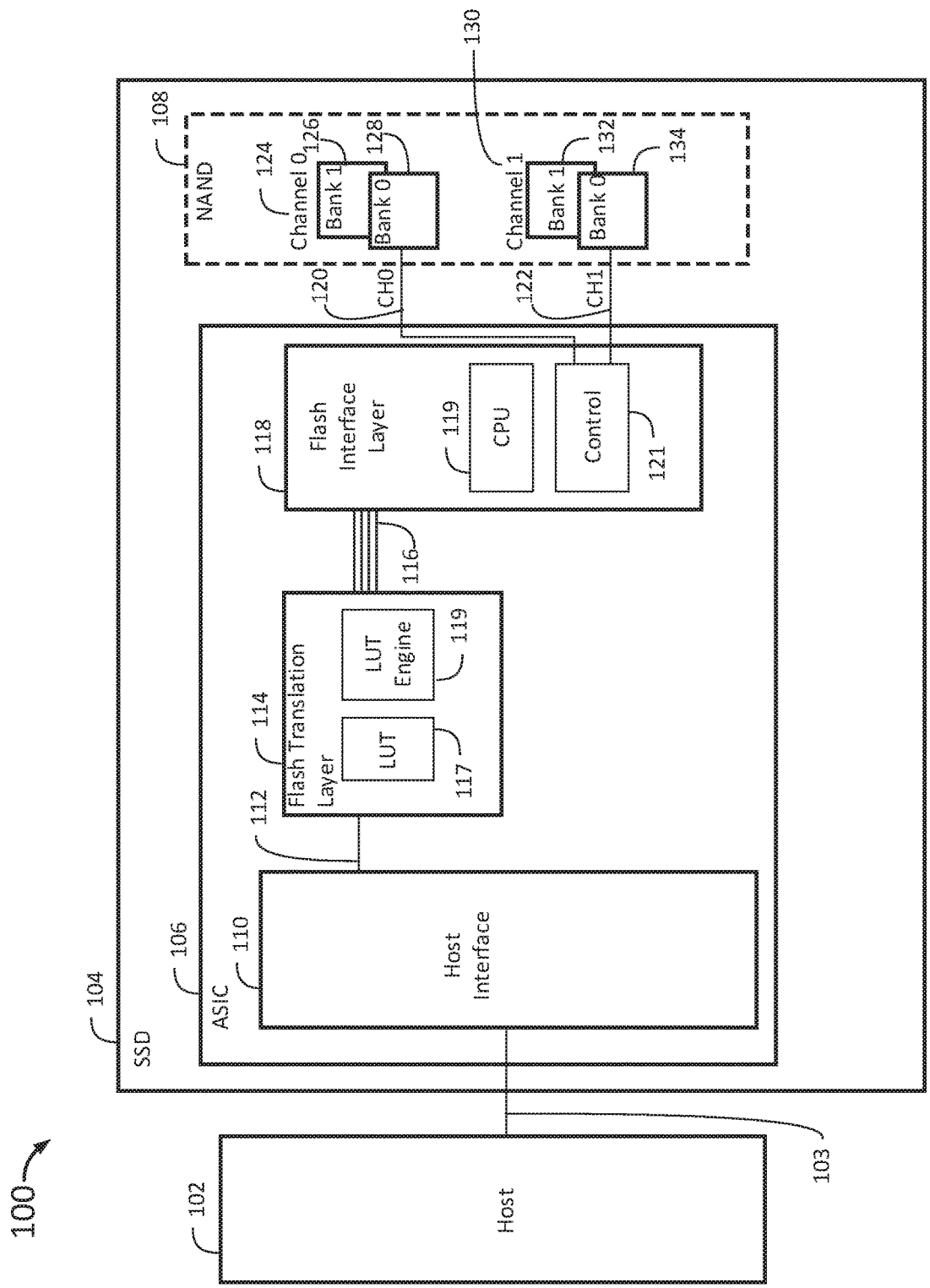
FIG. 1 shows a block diagram of a solid-state drive ("SSD") memory device system which supports scheduling of error recovery messages.

FIG. 1 shows a block diagram of an SSD memory device system 100. The SSD memory device system 100 includes an SSD 104 communicatively coupled to a host 102 by bus 103. The SSD 104 includes an application-specific integrated circuit ("ASIC") 106 and NAND memory device 108. The ASIC 106 includes a host interface 110, a flash translation layer 114, and a flash interface layer 118. The host interface 110 is communicatively coupled to the flash translation layer 114 by internal bus 112. The flash translation layer 114 includes a lookup table ("LUT") 117 and LUT engine 119. The flash translation layer 114 transmits memory commands 116 to the flash interface layer 118. The flash interface layer 118 includes a flash interface central processing unit ("CPU") 119 and a flash interface controller 121. The flash interface CPU 119 controls the flash interface controller 121. The flash interface layer 118 is communicatively coupled to the flash interface controller 121 which is communicatively coupled to the NAND memory device 108 by multiple NAND memory channels. Two channels are illustrated here for clarity, but any number of channels may couple the flash interface controller 121 to memory within the NAND memory device 108. As illustrated, flash interface controller 121 is coupled by first channel (Ch 0) 120 to multiple banks 124 of memory die, here including first bank 126 and second bank 128. Flash interface controller 121 is coupled by second channel (Ch 1) 122 to multiple banks 130 of memory die, here including third bank 132 and fourth bank 134. While only two banks are shown in FIG. 1 for each of the channels, any number of banks can be coupled to the channels.

The SSD 104 receives various storage protocol commands from the host 102 to access data stored in the NAND memory device 108. The commands are first interpreted by the flash translation layer 114 into one or more memory commands 116 which are routed to the flash interface layer 118 in multiple queues, for example multiple inter-process communication ("IPC") queues. The SSD 104 may also generate internal commands and messages that require accessing data stored in the NAND memory device 108, which are also routed to the flash interface layer 118 IPC queues. The flash interface layer 118 assigns the commands and messages to the appropriate IPC queue before fetching commands in order from the queues to be scheduled and processed by the flash interface CPU 119. The flash interface CPU 119 sends instructions to the flash controller 121 to perform various tasks based on the scheduled commands and messages. This process of distributing commands and messages to IPC queues and the flash interface CPU 119 fetching and processing the commands and messages is further described in FIG. 2.

As used herein, a person of skill would understand the term 'message' to mean a means to convey an instruction, directive containing information. The term 'error recovery message' would be understood by a person of skill to mean an instruction or directive containing information as to what happened in an error on a memory die and how the error can be recovered from. An error recovery message, as used herein, may also be understood as a communication, report, task, order, or request to perform error recovery, such that in response to the content of an error recovery message the CPU forms a command to perform an error recovery action on a memory die. As an example, an error recovery message may result in a set of read commands being issued to the memory die which define different voltage thresholds for the read commands. Though IPC queues are described herein, the various commands and messages routed to the flash interface layer may be assigned to any appropriate queue, and the queue need not be an IPC queue.

Figure 2:
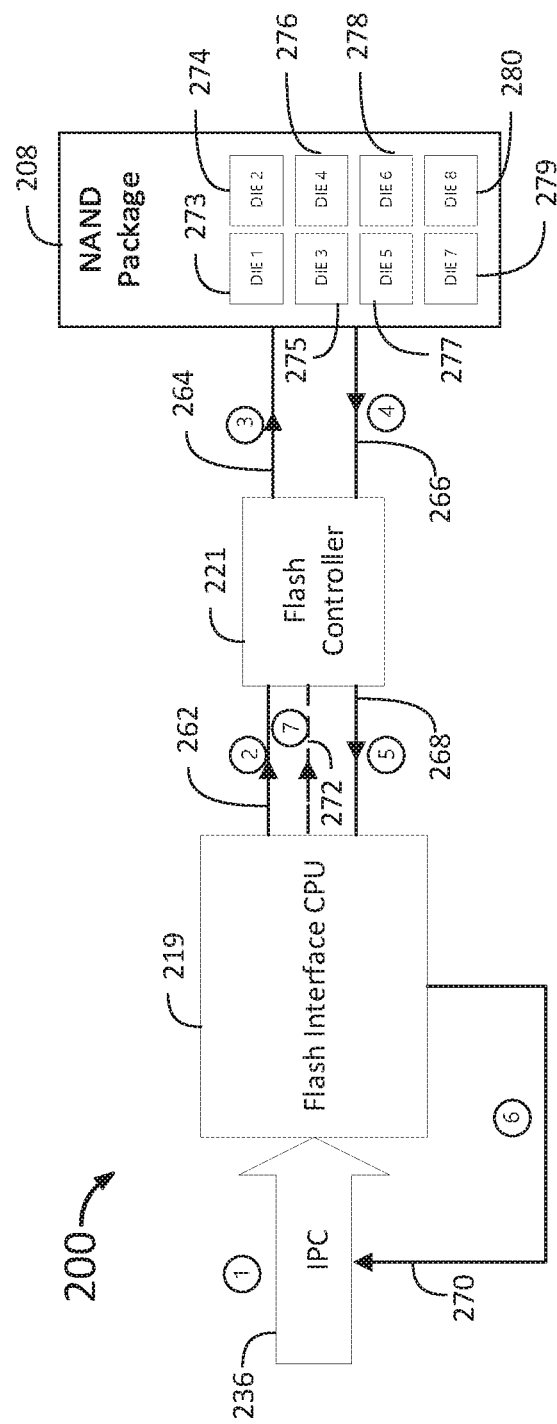
FIG. 2 shows a block diagram of a process of handling read commands and read errors in an SSD memory device.

FIG. 2 shows a block diagram 200 of a process of handling read commands and read error recovery messages in an SSD memory device, such as SSD 104 in FIG. 1. The block diagram 200 shows the flow of the processing method starting from the commands and messages in the IPC queues 236, to the flash interface CPU 219, to the flash controller 221, and to the NAND memory device 208. The flash interface CPU 219 and the flash controller 221 are components within the flash interface (for example flash interface layer 118 of FIG. 1). At step 1, the flash interface CPU 219 fetches a read command as an IPC message from a head of a queue in IPC queues 236. The flash interface CPU 219 fetches the commands from the heads of the IPC queues 236 according to a scheduling algorithm. In some implementations, the scheduling algorithm is a round-robin strategy, which gives equal priority weighting to each queue. In some implementations another scheduling algorithm is used. In some implementations, the scheduling algorithm enables the flash interface CPU 219 to fetch multiple IPC messages from the head of the queue based on the attributes of read messages fetched. In some implementations, the scheduling algorithm enables the flash interface CPU 219 to fetch a command from a position in a queue other than the head of a queue. In some implementations, the scheduling algorithm accounts for varying priority of queues within the IPC queues 236. The flash interface CPU 219 processes the commands and transmits instructions to the flash controller 221 to issue memory command signals on the memory channel to the NAND memory device 208 in response to the commands and messages.

At step 2, the flash interface CPU 219 creates a read packet based on the received IPC message and transmits 262 the read packet to the flash controller 221. The flash controller 221 processes the read packet and transmits the read command signals to the NAND memory device 208 at step 3 over pathway 264. The flash controller 221 transmits the command signals to the NAND memory device 208 over the appropriate channel (for example first channel (Ch 0) 120 or second channel (Ch 1) in FIG. 1) to reach the destination bank (for example first bank 126, second bank 128, third bank 132, or fourth bank 134 in FIG. 1) for execution of the read. The NAND memory device 208 is shown in FIG. 2 with eight available dies including first die 273, second die 274, third die 275, fourth die 276, fifth die 277, sixth die 278, seventh die 279, and eighth die 280.

At step 4, an indication responsive to the attempted execution of the read at the NAND memory device 208 along with any data read is detected by the flash controller 221 at pathway 266. The indication may indicate a failure of the execution of the memory read command and no data is returned, or the indication indicates success and data is returned. The flash controller 221 checks the data returned using an error correcting code ("ECC") decoder (not shown for clarity) which may indicate either success (that the data has been read successfully) or failure (that an uncorrectable ECC failure has occurred). The flash controller 221 transmits the indication of a memory read failure or an ECC failure to the flash interface CPU 219 at step 5 by pathway 268. In response to the indication of the read error as a result of the memory read failure or ECC failure, the flash interface CPU 219 must attempt to recover the data using one of various read error recovery methods. In some implementations, the flash interface CPU 219 executes an enhanced, stronger error correction algorithm to attempt correction of identified errors. In some implementations, the flash interface CPU 219 determines new memory cell threshold voltage values based on an error recovery algorithm to attempt recovery of the identified errors. In some implementations, the flash interface CPU 219 prepares one or more read commands having various threshold voltage values to re-attempt the memory read on the NAND memory device 208. Each of these error recovery algorithms, as well as known alternative error recovery algorithms and methods, may be used in combination with one or more of the embodiments described herein.

At step 6, the flash interface CPU 219 prepares a new error recovery IPC message 270 including relevant details about the read to perform the necessary recovery steps, and transmits the IPC message to its own IPC queue to issue further read correction steps. When more than one read error occurs at a time, more error recovery IPC messages are created by the flash interface CPU 219 and added to the IPC queue. In order to efficiently handle these error recovery messages, the messages must be appropriately grouped. Messages and commands may be grouped according to the type of command or message, for example into a response message queue group, an error recovery queue group, a host read commands queue group, and another command queue group encompassing read, write, and erase commands other than host-initiated commands, or any other appropriate groupings. The priority of commands and messages can also be accounted for in the grouping of commands and messages. Accordingly, in step 6, when the flash interface CPU 219 transmits the message to its own IPC queue, the message must be assigned to an appropriate queue within the IPC queues 236. As will be further described below in FIG. 3, the flash interface CPU 219 transmits the error recovery IPC message to a die-based queue within the IPC queues 236. The IPC queues 236 includes at least one error recovery IPC queue per die within the NAND memory device 208, and may include multiple queues for each die.

The error recovery IPC message is an indication that an error has occurred, and may also include indications as to the type and severity of the error, which dictate how the message is processed when it reaches the head of its respective IPC queue. Once the error recovery message reaches the front of an IPC queue and is fetched for scheduling, the flash interface CPU 219 processes the error recovery message to determine the actions required by the message. At step 7, the flash interface CPU 219 issues a read packet based on the error IPC message by pathway 272 to the flash controller 221 for transmission to the NAND memory device 208. As described above, in some implementations, the read packet includes updated threshold voltage values to attempt to recover the data. In some implementations, the read packet addresses the data recovery by another read error correction or recovery method. The steps 1-7 are repeated until the read error is fully corrected.

Errors in the dies of the NAND memory device 208 that prevent the completion of a command occur randomly, and are likely to increase with increased age and wear of a die. Conventional systems include a single IPC queue for error recovery messages arriving at the IPC queues 236 of the flash interface CPU 219. In these conventional systems, all error recovery messages are routed to a single error recovery message IPC queue creating a long wait for scheduling of the messages and ineffective use of resources. Use of a single error recovery message IPC queue results in large latency times and fails to take into account that various commands, and error recovery messages responsive to them, may have different priority levels and associated levels of acceptable latency.

Figure 3:
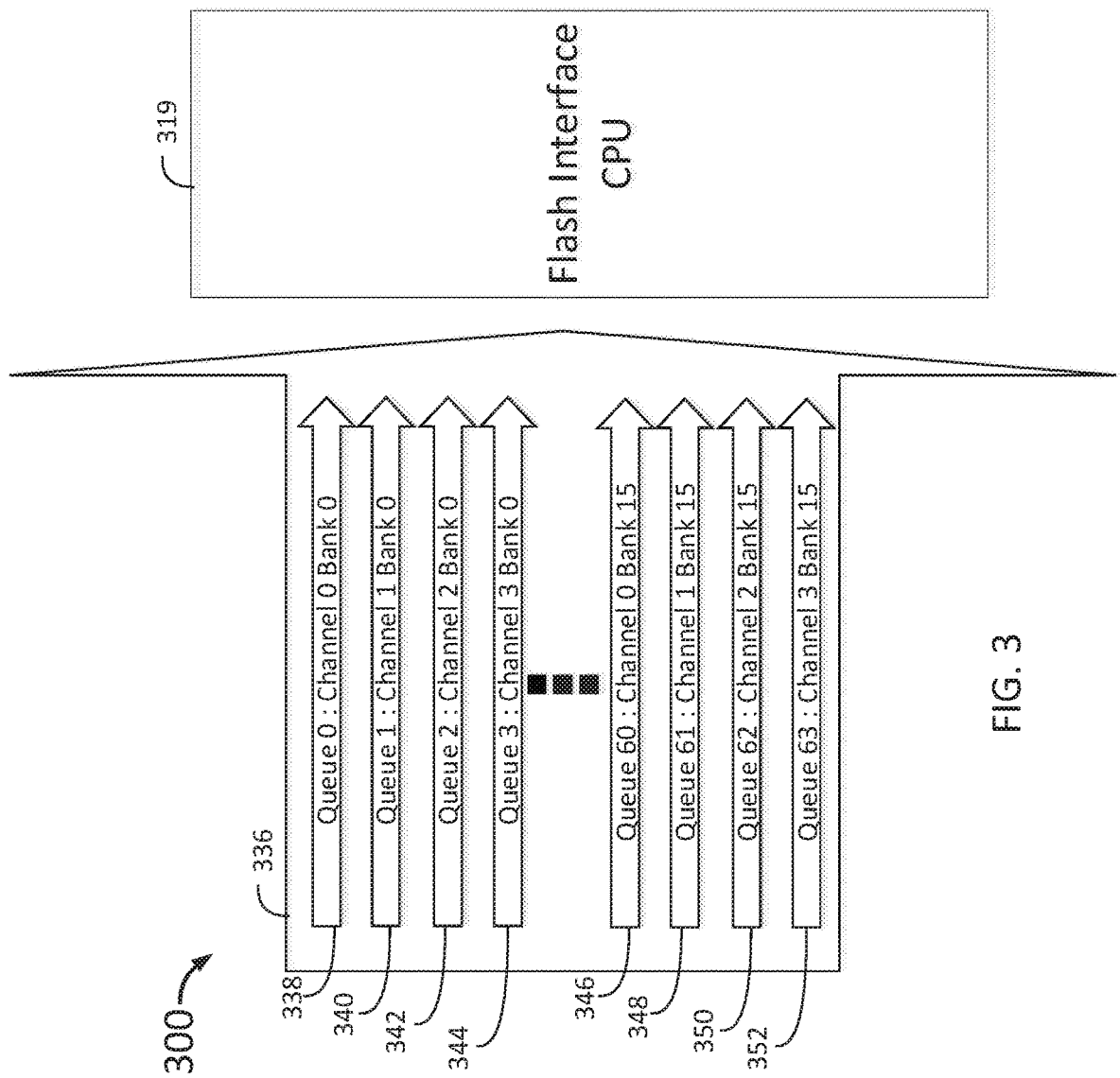
FIG. 3 shows a block diagram of a die-based error recovery message queue entering the SSD memory device processor.

In contrast to the conventional single error recovery message IPC queue, FIG. 3 shows a block diagram 300 of a die-based error recovery message IPC queue 336 for grouping error recovery message queues on a per die (also referred to as "per bank" herein) basis as the messages are received at IPC queues of the flash interface CPU 319. The error recovery message IPC queue 336 includes a separate queue for each die of the NAND memory device to facilitate efficient scheduling of error recovery messages. The die-based error recovery message IPC queue 336 can include any number of die-based queues with at least one queue per die. All error recovery messages that will need to be executed on a particular die are routed through one of the queues assigned to the die, so that messages related to error recovery on different dies can be scheduled in parallel to efficiently handle error recovery. For clarity, FIG. 3 shows only eight queues, representing a total of 64 queues, and includes the first four queues (first queue 338, second queue 340, third queue 342, and fourth queue 344) and the last four queues (sixty-first queue 346, sixty-second queue 348, sixty-third queue 350, and sixty-fourth queue 352). FIG. 3 corresponds to a 4-channel by 16-bank die array. Such an array has 64 dies, and the die-based error recovery queue group 336 has 64 queues as a result.

As an example, first queue 338 corresponds to a first bank on a first channel, second queue 340 corresponds to a first bank on a second channel, third queue 342 corresponds to a first bank on a third channel, and fourth queue 344 corresponds to a first bank on a fourth channel. Sixty-first queue 346 corresponds to a sixteenth bank on the first channel, sixty-second queue 348 corresponds to a sixteenth bank on the second channel, sixty-third queue 350 corresponds to a sixteenth bank on the third channel, and sixty-fourth queue 352 corresponds to a sixteenth bank on the fourth channel. In this way, each queue corresponds to a particular bank accessed by a particular channel in the memory device, and error recovery messages to be carried out at that channel and bank are routed through the corresponding queue. The dies in a NAND memory device are each unique and can operate independently. Blocks in the dies can have different levels of wear depending on the usage of the block, and an error can happen on any die randomly. If the flash interface CPU 319 utilizes die-based error recovery message queues, such that there is a queue established for each die, then when there are multiple errors, the flash interface CPU 319 can quickly and efficiently schedule multiple error recovery actions across the NAND dies in parallel. Using die-based error recovery message queues enables parallel scheduling of error recovery messages across the various channels and banks so that error recovery is more efficiently handled with less latency. The system can also be effectively scaled up or down depending on the device capacity.

FIGS. 4A and 4B show block diagrams of mappings of error recovery messages for execution on a particular die to a die-based queue for a 4-channel by 4-bank configuration and a 4-channel by 8-bank configuration, respectively. As described in FIG. 3, the error recovery message IPC queue includes a queue for each bank in the device, such that there is a queue corresponding to each bank accessed by a channel. FIG. 4A illustrates a mapping 400 of the channels 404 and banks 406 to a die-based error recovery message queue 402 for a 4-channel by 4-bank configuration. FIG. 4B shows a block diagram of a mapping 401 of the channels 414 and banks 416 to a die-based error recovery message queue 412 for a 4-channel by 8-bank configuration.

The utilization of die-based error recovery message queues improves the efficient scheduling of messages and commands across the NAND memory device. As an example, FIG. 5A shows a block diagram 500 of a conventional process of message scheduling with a single read error recovery message queue, and is contrasted with FIG. 5B which shows a block diagram 550 of a process of message scheduling with multiple die-based read error recovery message queues.

Figure 5A:
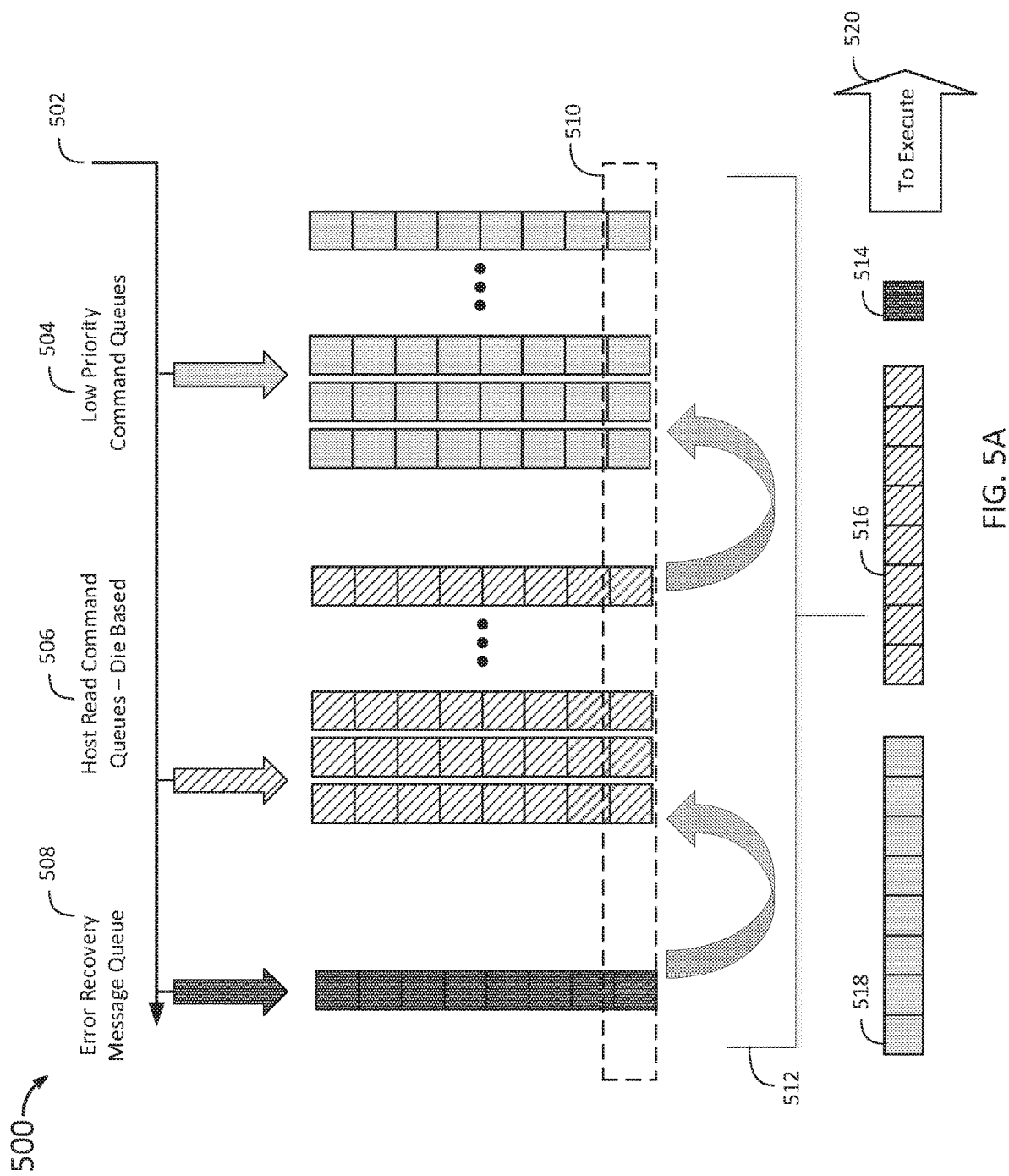
FIG. 5A shows a block diagram of a process of message scheduling with a single read error recovery queue.

FIG. 5A shows a block diagram 500 illustrating the process of scheduling commands and messages at the flash interface CPU (for example flash interface CPU 119 in FIG. 1, flash interface CPU 219 in FIG. 2, or flash interface CPU 319 in FIG. 3) with a single error recovery message IPC queue. FIG. 5A shows that as commands and messages are transmitted to the CPU, they are added to the tail of the appropriate IPC queue (step 502). The IPC queues include a single error recovery message queue 508, as well as multiple low priority command queues 504, and die-based host read command queues 506 (i.e., there is one queue for each die in the NAND memory device). The commands and messages are added to the tail ends of the queues as they arrive, and move up in position through the queue as the commands and messages at the heads of the queues are scheduled and processed. The commands and messages to be scheduled are chosen from the head of the IPC queues according to a selection process (step 510). In some implementations, the selection process is a round-robin scheme. In some implementations, the CPU fetches a command from a position in the queue other than the head of the queue. In some implementations, the scheduling algorithm enables the CPU to fetch multiple IPC messages from the head of the queue based on the attributes of read messages fetched. The CPU fetches the first command or message of each queue (e.g., at the head of the queue), forms commands based on the fetched message for scheduling, and schedules the formed commands. Beginning with the error recovery message queue 508, the CPU fetches the first message at the head of the single queue 508 to form command 514 for scheduling. The CPU then moves on (step 512) to fetch the command at each of the heads of the host read command queues 506 to form commands 516 for scheduling, such that multiple host read commands are scheduled to the various dies of the NAND memory device. Finally, the CPU fetches (step 512) commands from the heads of each of the low priority command queues 504 to form commands 518 for scheduling. The selected message and commands from the heads of the various queues including the single error recovery message 508, the plurality of host read commands 506, and the plurality of low priority commands 504 are processed and the commands or instruction signals based on the messages are transmitted to the flash interface controller to execute the commands or take various actions (step 520). The CPU then begins a second iteration repeating the steps described above by fetching the command or message now at the head of each IPC queue and forming commands for scheduling. Scheduling the commands and messages using only a single error recovery message queue results in a single error recovery message being transmitted per scheduling round, which is inefficient and may cause problems when higher priority error recovery messages become stuck in the queue behind less important messages.

Figure 5B:
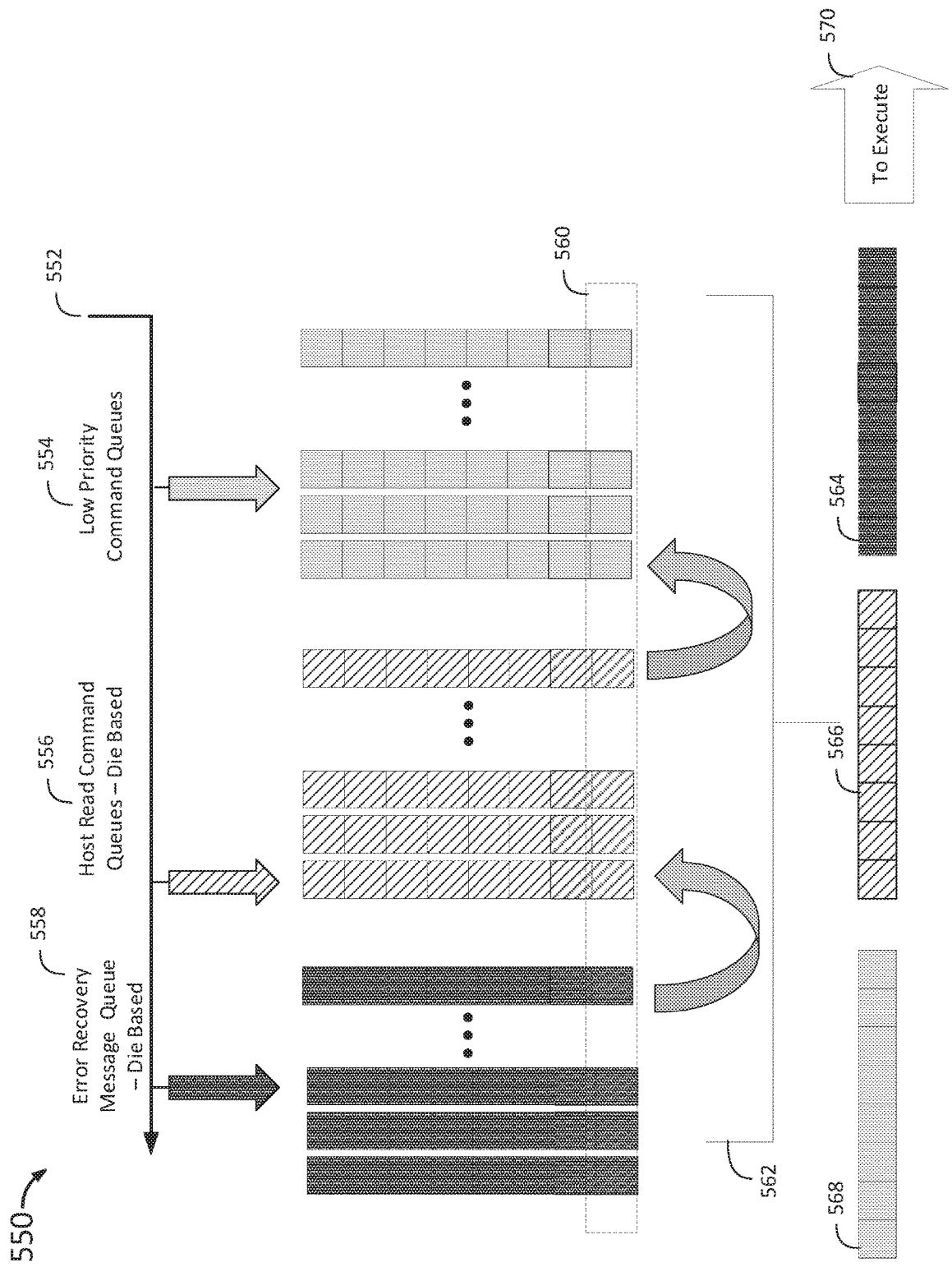
FIG. 5B shows a block diagram of a process of message scheduling with multiple die-based read error recovery queues.

In contrast, FIG. 5B shows a block diagram 550 of a process of IPC message scheduling at the flash interface CPU with multiple die-based read error recovery message queues. As described above in FIG. 5A, in FIG. 5B as commands and messages are transmitted to the CPU, they are added to the tail of the appropriate IPC queue (step 552). The IPC queues include a plurality of die-based error recovery queues 558, low priority command queues 554, and die-based host read command queues 556. When the CPU fetches the commands and messages from the heads of the queues according to a round-robin or other selection scheme (step 560), commands or messages are fetched from each of the heads of the queues, including the error recovery queues for each die. The CPU begins with the die-based error recovery message queues 558 and fetches the message at the head of each queue to form commands 564 for scheduling, before moving on (step 562) to fetch the commands at the head of each of host read command queues 556 to form commands 566 for scheduling, and finally (step 562) to fetch the command at the head of each queue in the low priority command queues 554 to form commands 568 for scheduling. The commands and messages from the heads of the various queues including the plurality of die-based error recovery messages queue 558, the plurality of host read command queues 556, and the plurality of low priority command queues 554 are all processed, and commands are formed and scheduled for transmission to the flash interface controller to execute the commands or take various actions (step 570).

Scheduling the messages from die-based error recovery queues results in optimized handling of read error recovery messages while reducing the total firmware overhead during error correction. The flash interface CPU is able to be more flexibly schedule and process error recovery messages while also processing and scheduling other commands and messages. Further, die-based error recovery queues can be easily scaled to accommodate various NAND architectures, such as IOD and IO Stream-based architectures, to improve error handling on these devices. Die-based error recovery queues can also improve error handling for quad-level cell ("QLC") devices, which may be more sensitive to error correcting code ("ECC") errors. In some implementations, the die-based error recovery message IPC queues can be further divided into plane-based queues within each die queue for SSDs having asynchronous independent plane read functionality ("AIPR-enabled") such that both planes of each die can be accessed independently and in parallel for optimized handling of error recovery on the die. This process is further described in U.S. patent application Ser. No. 17/022,911, titled "Plane-based Queue Configuration for AIPR-enabled Drives," filed Sep. 16, 2020 and concerning the use of die-based high and low priority error queues with further plane-based queues in AIPR-enabled SSDs.

Figure 6:
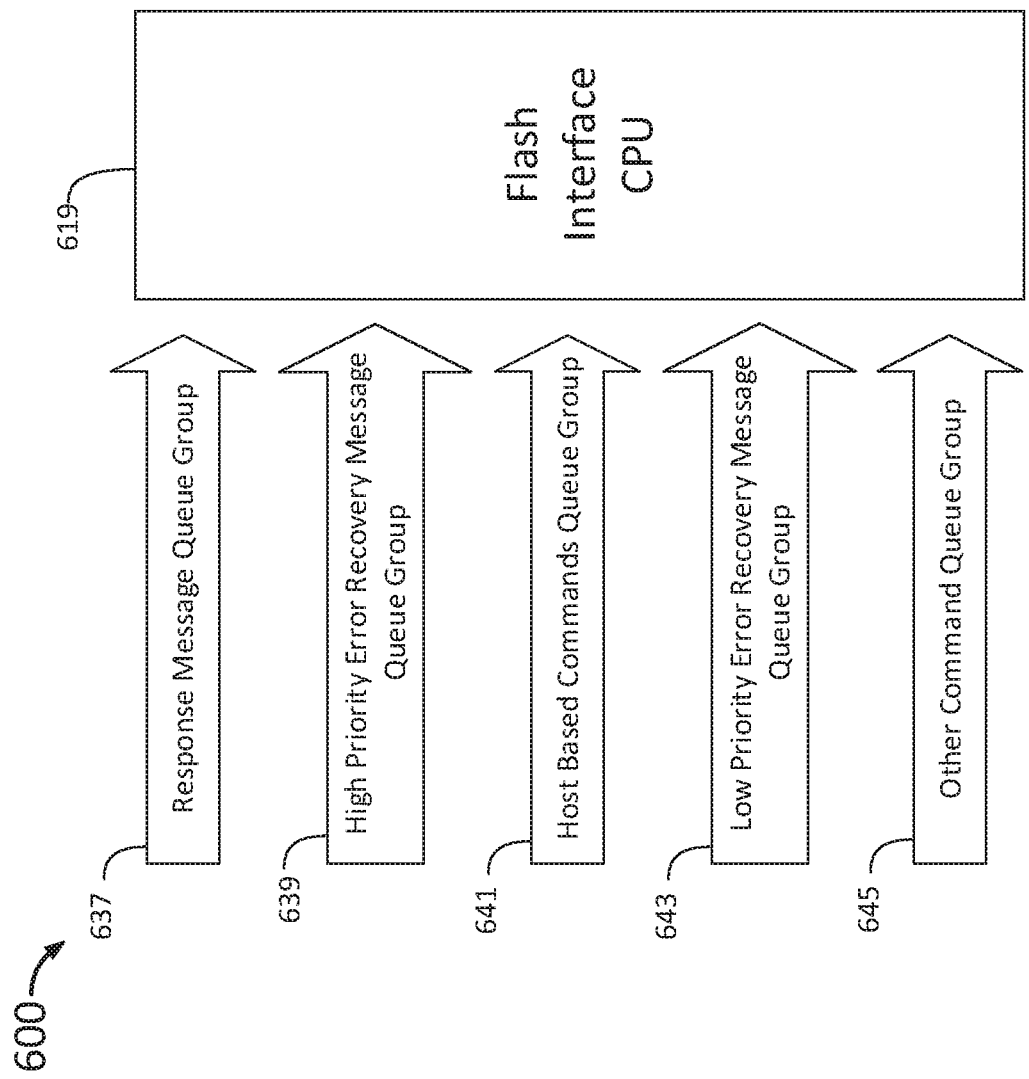
FIG. 6 shows a block diagram of various queues at the SSD memory device processor.

In some implementations, the efficiency of scheduling and executing error recovery messages can be further improved by also considering and taking into account the priority of the error recovery messages by implementing for each die-based error recovery message queue two or more priority queues, for example a high-priority error recovery message queue and a low-priority error recovery message queue. Other priority levels may also be implemented, or priority levels can be assigned to subsets of dies, as will be discussed further below. FIG. 6 shows a block diagram 600 of various IPC queue groups at the flash interface CPU 619 (for example flash interface CPU 119 in FIG. 1, flash interface CPU 219 in FIG. 2, or flash interface CPU 319 in FIG. 3), including a high priority error recovery message queue group 639 and low priority error recovery message queue group 643. The IPC queue groups include a response message queue group 637, a high priority error recovery message queue group 639, a host-based commands queue group 641, a low priority error recovery message queue group 643, and another command queue group 645. Although these queue groups are shown for clarity, other IPC queues may also be implemented at the flash interface CPU.

Different types of read commands are issued to the CPU, including read commands from the host, compaction read, patrol read, physical read, etc. The different read types each have different latency requirements; commands issued from the host have the strictest latency requirements, and reads issued internally to the drive in the background are generally the most flexible. If all read error recovery messages are grouped together without consideration for the latency requirements and priority of the read commands, situations can arise where a host-issued read requiring low latency is stuck behind a lower-priority internal read for error recovery. This significantly increases the latency of the host read, and the issue can become more problematic as the wear and age of the NAND block increase. Such an issue can arise where a single error recovery message queue is utilized, where per-channel recovery message queues are utilized, or even sometimes where die-based error recovery message queues are utilized.

Both the high priority error recovery message queue group 639 and low priority error recovery message queue group 643 are die-based queues, such as die-based error recovery message IPC queue 636. The high and low priority die-based error recovery message queues enable the flash interface CPU 619 to quickly schedule error recovery messages to the respective dies of the NAND memory device, to operate in parallel. Parallel operation of the error recovery messages improves the efficiency of the error recovery process and decreases latency. Further, by separating the error recovery messages by priority level into the high priority error recovery message queue group 639 and low priority error recovery message queue group 643, the flash interface CPU 619 can also account for latency requirements associated with the read error and error recovery message. For example, the flash interface CPU 619 can send the error recovery message to the high or low priority die-based queue depending on the type of read command that failed, as each type of read command may have different associated latency requirements. The type of read command may be indicated by the source of the original read command. For example, error recovery messages associated with a read command received from the host can be placed in the high priority error recovery message IPC queue, to reduce the amount of time that the message must wait before it is scheduled. An error recovery message associated with an internal read command can be placed into the low priority error recovery message IPC queue. In some implementations, as will be discussed below, the priority of an error recovery message can be determined based on the destination die on which the original read command was attempted. In some implementations, the IPC queues at the flash interface CPU are given varying levels of priority amongst themselves to ensure that important commands and messages are scheduled quickly. For example, the host read command group may have a higher priority than the low priority error recovery message IPC queue, to ensure that the host reads are scheduled faster and at a higher frequency than the low priority messages to reduce latency of host reads.

Figure 7:
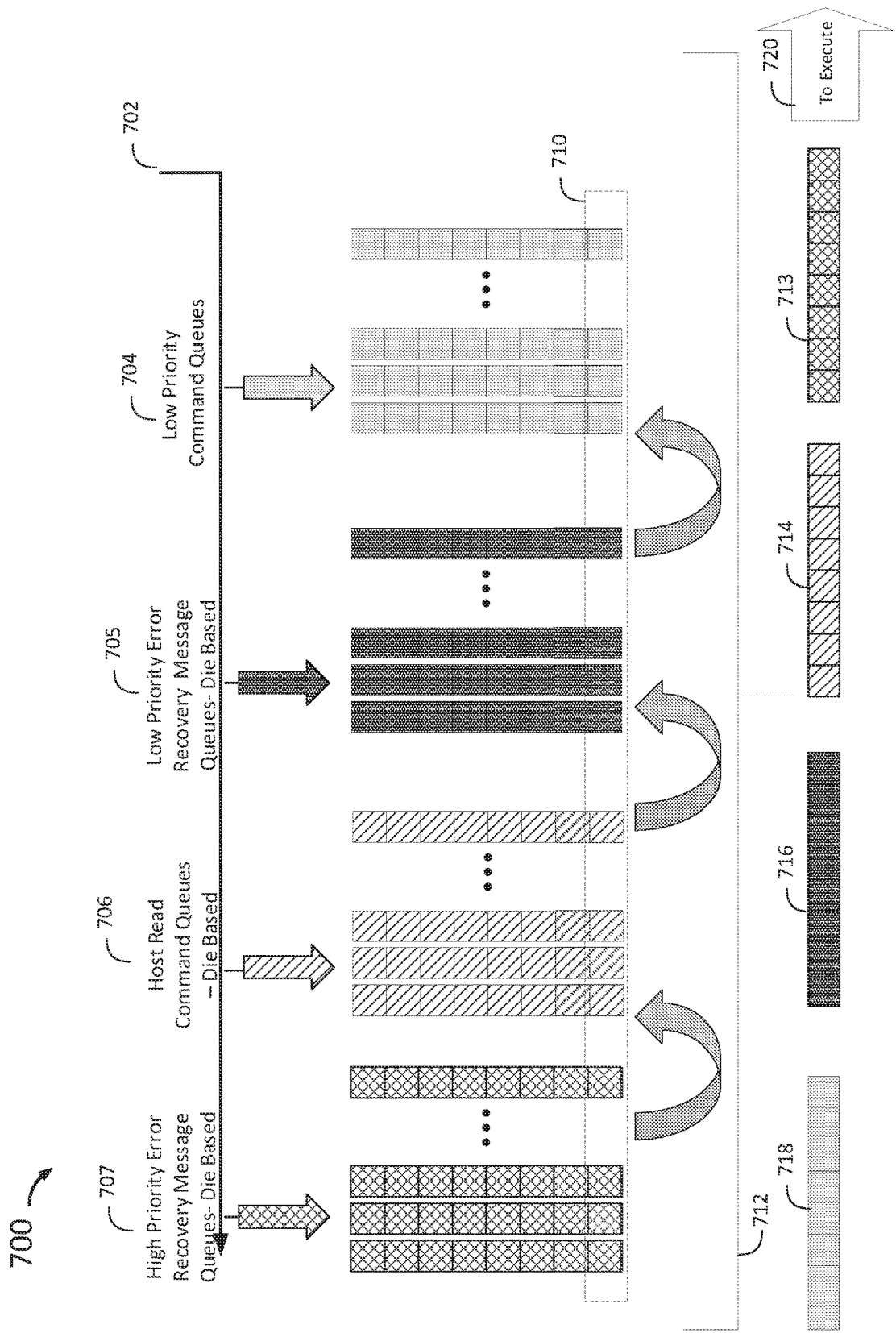
FIG. 7 shows a block diagram of a process of message scheduling with multiple die-based read error recovery queues for high and low priority commands.

FIG. 7 shows a block diagram 700 of a process of IPC message scheduling with multiple die-based read error recovery message queues for high and low priority error recovery messages. As described above in FIGS. 5A and 5B, in FIG. 7 as commands and messages are transmitted to the CPU (for example, flash interface CPU 119 in FIG. 1, flash interface CPU 219 in FIG. 2, flash interface CPU 319 in FIG. 3, flash interface CPU 619 in FIG. 6), they are added to the tail of the appropriate IPC queue (step 702). The IPC queues include low priority command queues 704, low priority die-based error recovery message queues 705, die-based host read command queues 706, and high priority die-based error recovery message queues 707. When the CPU fetches the commands and messages to be scheduled from each of the queue heads according to a round-robin or other selection scheme (step 710), the command or message at the head of each queue is fetched in turn, including from the high and low priority error recovery queues for each die. The CPU begins with the high priority die-based error recovery message queues 707 and fetches the message at the head of each die-based queue 707 to form commands 713 for scheduling (step 712), before moving on (step 710) to fetching the head of each of host read command queues 706 to form commands 714 for scheduling (step 712). The CPU then fetches the messages at the heads of each of low priority die-based error recovery message queues 705 to form commands 716 for scheduling (step 712), and finally fetches the heads of each of the low priority command queues 704 to form commands 718 for scheduling (step 712). Following this process, the selected commands and messages from the heads of the various queues including the messages from the high priority die-based error recovery message queues 713, the commands from the die-based host read command queues 714, the messages from the low priority error recovery message queues 716, and the commands from the low priority command queues 718 are all processed and the commands or instruction signals based on the messages are transmitted for execution (step 720).

By including die-based error recovery message queues and high and low priority levels of these per-die queues, higher efficiency in scheduling can be achieved. In some implementations, the CPU can determine which queue each read error recovery message should be assigned based on the type of read command that failed. For example, if the failed read command was an internal read command, it can be assigned to the low priority queue, and if the failed read command was a host-initiated read command, then it can be assigned the high priority queue. The CPU fetches messages from each of the high and low priority queues for each of the die queues, so that the high priority error recovery messages need not wait in a queue behind a number of low priority messages. The messages can be processed and the read commands or other instructions for error recovery based on the message can be transmitted to the flash interface controller and transmitted to the NAND device in parallel to improve the efficiency of the error correction and data recovery.

In some implementations, each die-based error recovery message queue is separated into a high priority queue and a low priority queue, such that there are twice as many queues as there are dies in the NAND memory device. In some implementations, each die-based error recovery message queue is separated into multiple priority queues, for example into three, four, or more queues of varying priority. The division of each die-based queue into two or more priority queues may be used in combination with one or more of the aforementioned embodiments.

Figures 8A, 8B:
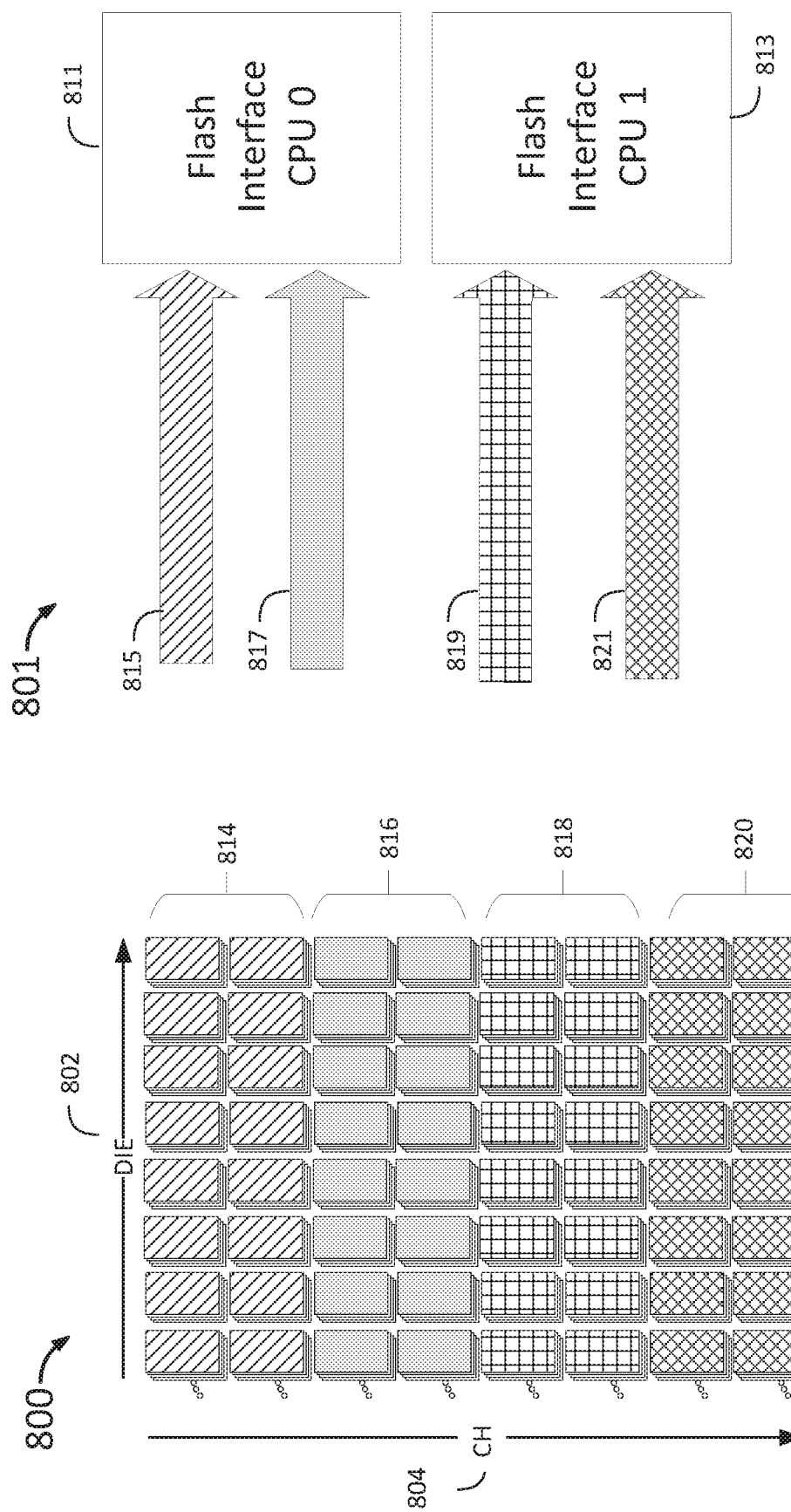
FIG. 8A shows a block diagram of an IOD-enabled SSD die array.
FIG. 8B shows a block diagram of error recovery message queues for the IOD-enabled SSD die array of FIG. 8A.
Figure 10:
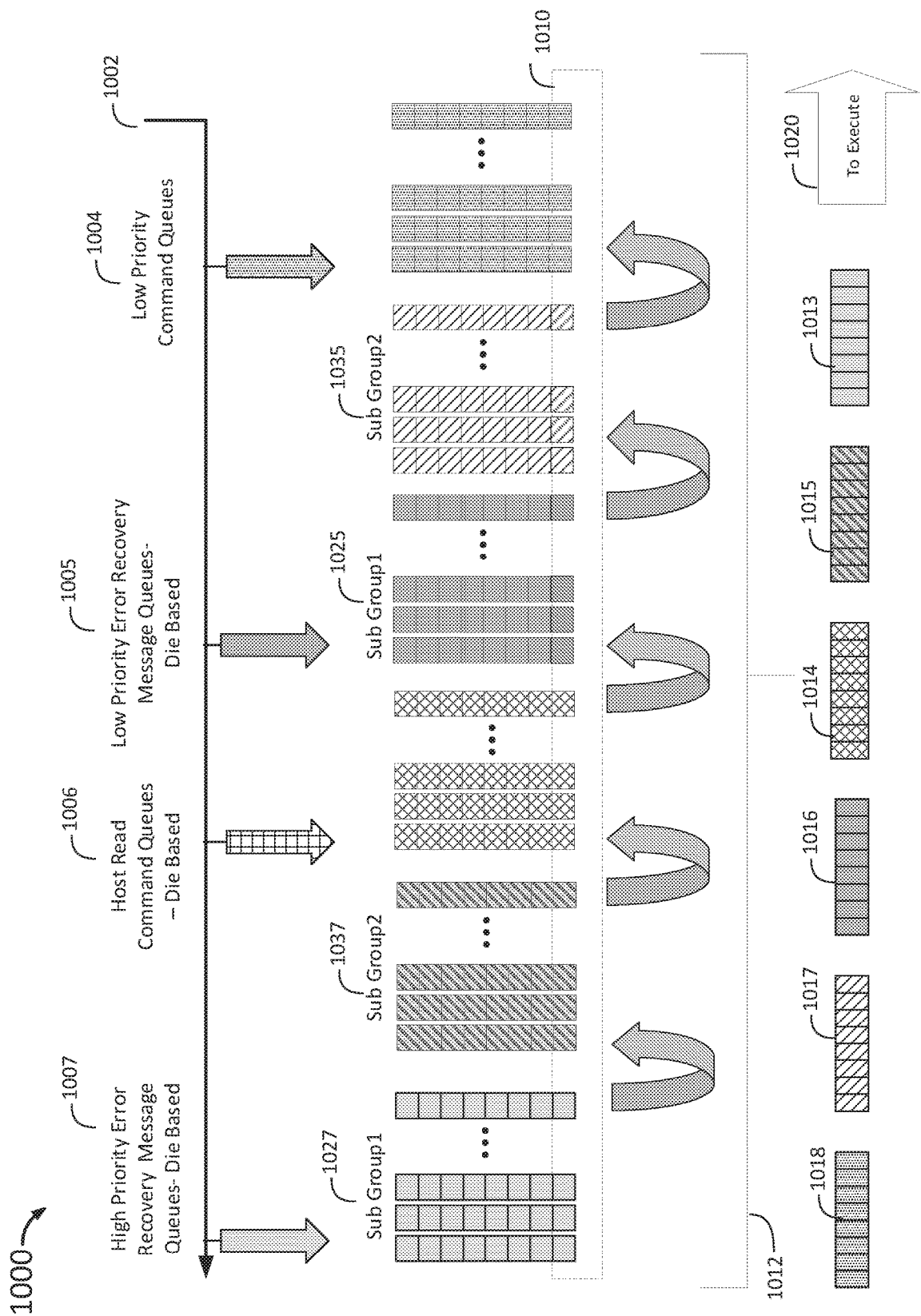
FIG. 10 shows a block diagram of a process of message scheduling with multiple die-based read error recovery queues for high and low priority commands for an IOD-enabled SSD.
Figure 11:
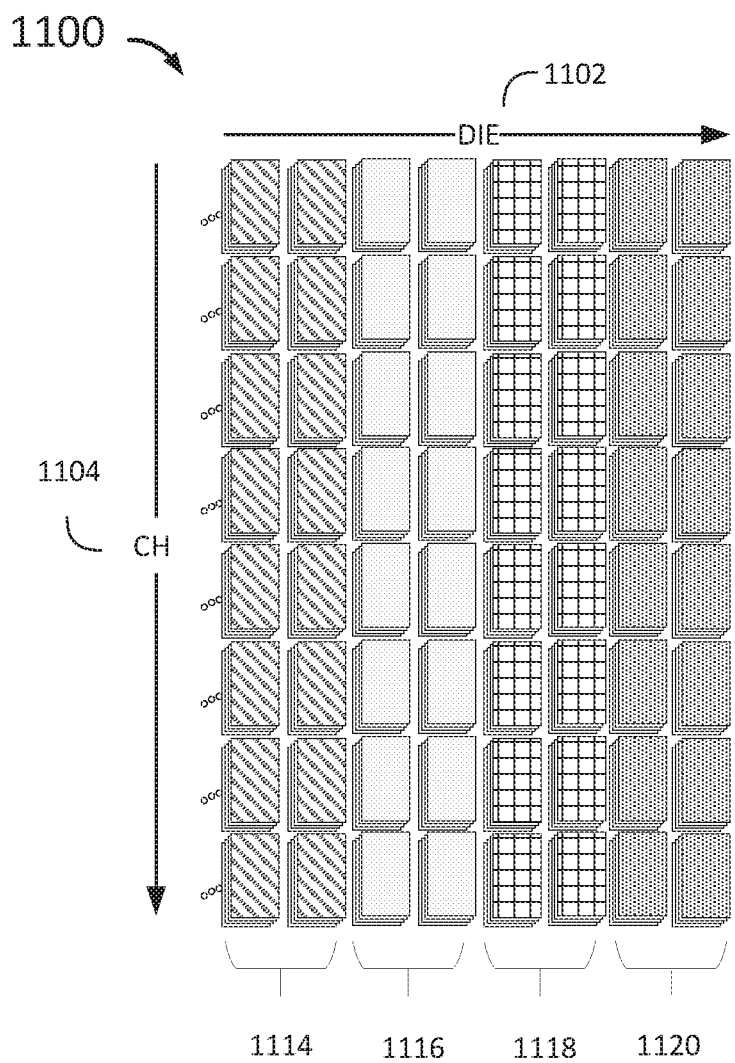
FIG. 11 shows a block diagram of an IO Stream-enabled SSD die array.

The die-based priority queues can be implemented in a wide variety of systems and can be effectively scaled for implementation in IOD Set-enabled and IO Stream SSDs. In IOD Set-enabled and IO Stream SSDs, subsets of dies can be grouped and assigned a common priority level, error recovery requirements or levels, and/or scheduling mechanism for messages and commands to be executed at the group of dies. Any of the die-based error recovery message queue structures or methods described above can be logically grouped to support IOD Set-enabled and IO Stream SSDs. FIGS. 8-10 illustrate the implementation of such a system in an IOD Set-enabled SSD and FIGS. 11-12 illustrate its implementation in an IO Stream SSD. FIG. 8A shows a block diagram 800 of an IOD Set-enabled SSD die array. An IOD Set-enabled SSD defines a number of sets of dies, and may assign each set different tasks or priorities. IOD Set-enabled SSDs are capable of increased flexibility because of the ability to group and define sets of dies according the user requirements. IOD Set-enabled SSDs include "clubbed" or grouped dies that can be assigned different error recovery requirements, scheduling mechanisms, and error correction levels based on user requirements. The IOD Set-enabled SSD of FIG. 8A includes an SSD die array having eight channels 804 and 8 dies 802. The die array includes four defined sets of sixteen dies: first set 814, second set 816, third set 818, and fourth set 820. All of the dies of the logical block for each two channel set are contained within the two channels, as illustrated by the various patterns of first set 814, second set 816, third set 818, and fourth set 820.

FIG. 8B shows a block diagram 801 illustrating queues associated with each set for transmitting error recovery messages into the flash interface CPUs. The block diagram 801 shows a first flash interface CPU 811 and a second flash interface CPU 813. The queues 815 for the first set 814 and the queues 817 for the second set 816 enter first flash interface CPU 811. The queues 819 for the third set 818 and the queues 821 for the fourth set 820 enter second flash interface CPU 813. Each queue includes die-based priority queues, and each set of dies is treated by the CPU based on characteristics assigned to the set, for example, based on the assigned error recovery requirements, scheduling mechanisms, or error recovery levels of the set. Accordingly, the queue for the first set 814 includes a high priority and low priority queue for each of the dies in the set. The CPU fetches the messages from the heads of these queues based on the predetermined characteristics of the set. For example, the CPU may fetch messages from one set according to a different scheduling algorithm than another set. The CPU may also utilize the predetermined characteristics in determining the error recovery algorithm to be used to recovery the data or correct the error.

FIGS. 9A and 9B show block diagrams of a mapping of error recovery messages to a die-based queue for a 4-channel by 4-bank configuration and a 4-channel by 8-bank configuration, respectively, for an IOD-enabled SSD die array. FIG. 9A illustrates a mapping 900 of the channels 904 and banks 906 to a die-based error recovery message queue 902 for 2 channel IOD sets in a 4 channel IOD-enabled SSD die array. The mapping 900 includes a first set 903a-d utilizing channels 0 and 1, and a second set 905a-d utilizing channels 2 and 3. FIG. 9B illustrates a mapping 901 of the channels 914 and the banks 916 to a die-based error recovery message queue 912. The mapping 901 includes a first set 913a-h utilizing channels 0 and 1, and a second set 915a-h utilizing channels 2 and 3. As messages come into the flash interface CPU they are assigned to a queue based on the mappings 900 and 901, and are fetched and scheduled according to the characteristics assigned to the set. In some implementations, at least one set of dies on the IOD-enabled SSD die array is assigned a priority which the CPU accounts for in scheduling messages to the at least one set. In some implementations, the messages may be further assigned to a priority queue within a particular die queue based on additional information in the message indicating the priority level, destination die, or origin of an associated read command. The mappings in FIGS. 9A and 9B take advantage of channel parallelism by mapping the queue to the channel so that the NAND bus can be utilized in parallel, reducing latency and increasing the efficiency of error recovery.

FIG. 10 shows a block diagram 1000 of a process of IPC message scheduling with multiple die-based read error recovery message queues for high and low priority commands for an IOD-enabled SSD. In FIG. 10, commands and messages are transmitted to the CPU (for example flash interface CPU 119 in FIG. 1, flash interface CPU 219 in FIG. 2, flash interface CPU 319 in FIG. 3, flash interface CPU 619 in FIG. 6, or flash interface CPUs 811 and 813 in FIG. 8) and are added to the tail of the appropriate IPC queue (step 1002). The IPC queues include a plurality of low priority command queues 1004, die-based low priority error recovery message queues 1005, die-based host read command queues 1006, and die-based high priority error recovery message queues 1007. Each of the low priority error recovery message queue 1005 and the high priority error recovery message queue 1007 further includes multiple sub-groups for the defined sets of the IOD Set-enabled SSD. The high priority error recovery message queue 1005 includes a first high priority sub-group 1027 and a second high priority sub-group 1037. The low priority error recovery message queue 1007 includes first low priority sub-group 1025 and second low priority sub-group 1035. When the CPU fetches the commands and messages from the head of each of the queues according to a round-robin or other selection scheme (step 1010), commands or messages are fetched from each of the heads of the queues, including the read error recovery message queues for each die in each priority level, and for each sub group (or defined set within the IOD-enabled SSD). The CPU begins by fetching messages from the heads of the die-based high priority error recovery message queues 1007 and fetches the message at the head of each queue in the first high priority subgroup 1027 to form commands 1013 for scheduling, and fetches the message at the head of each queue in the second high priority subgroup 1037 to form commands 1015 for scheduling. The CPU then (step 1012) fetches the commands at the head of each of host read command queues 1006 to form commands 1014 for scheduling. The CPU then fetches the messages at the head of each queue in the first low priority subgroup 1025 of the low priority error recovery message queues 1005 to form commands 1016 for scheduling, followed by the messages at the head of each queue in the second low priority subgroup 1035 of the low priority error recovery message queues 1005 to form commands 1017 for scheduling. Finally, the CPU fetches the commands at the head of each queue in the low priority command queues 1004 to form commands 1018 for scheduling. The CPU processes each of the selected commands and messages from the heads of each die-based queue in each of first high priority sub group 1027 and second high priority subgroup 1037 of the high priority read error recovery message queues 1007, the die-based queues in the host read command queues 1006, the die-based queues of the first low priority subgroup 1025 and the second low priority subgroup 1035 of the low priority error recovery message queues 1005, and the die-based queues of the low priority command queues 1004, and forms commands or signals based on the messages which are then transmitted for execution (step 1020).

FIG. 11 shows a block diagram 1100 of an IO Stream-enabled SSD die array. An IO Stream-enabled SSD defines a number of streams by grouping dies spread across multiple channels, and, like an IOD Set-enabled SSD, assigns each stream different tasks or characteristics based on user requirements. For example, each stream may be assigned error recovery requirements, scheduling mechanisms, or error correction levels that differ from other streams. IO Stream-enabled SSDs are capable of increased flexibility because of this ability to group and define streams of dies according the user requirements. The IO Stream-enabled SSD of FIG. 11 includes an SSD die array having eight channels 1104 and eight dies 1102. The die array includes four defined sets of sixteen dies: first set 1114, second set 1116, third set 1 layer 118, and fourth set 1120. The logical blocks of each stream are spread amongst dies on multiple channels, as illustrated by the various patterns of first set 1114, second set 1116, third set 1 layer 118, and fourth set 1120. Defining the high and low priority error recovery message queues on a per die basis, as described above, is compatible with the IO Stream-enabled SSD with very few changes to firmware.

FIGS. 12A and 12B show block diagrams of mappings of error recovery messages to a die-based queue for a 4-channel by 4-bank configuration of a 2 bank IO Stream-enabled SSD die array and a 4-channel by 8-bank configuration of a 2 bank IO Stream-enabled SSD die array, respectively. FIG. 12A illustrates a mapping 1200 of the channels 1204 and banks 1206 to a die-based error recovery message queue 1202 for a 4-channel by 4-bank configuration for a of a 2 bank IO Stream. The mapping 1200 includes a first stream 1203 including dies from the first bank (Bank 0) and second bank (Bank 1), and a second stream 1205 including dies from the third bank (Bank 2) and fourth bank (Bank 3). FIG. 12B shows a block diagram of a mapping 1201 of the channels 1214 and banks 1216 to a die-based error recovery message queue 1212 for a 4-channel by 8-bank configuration of a 2 bank IO Stream. The mapping 1201 includes four streams indicated by the different shadings of the table: a first stream 1213 including dies from the first and second banks (Bank 0 and Bank 1), a second stream 1215 including dies from the second and third banks (Bank 2 and Bank 3), a third stream 1217 including dies from the fifth and sixth banks (Bank 4 and Bank 5), and a fourth stream 1213 including dies from the seventh and eighth banks (Bank 6 and Bank 7).

Figure 13:
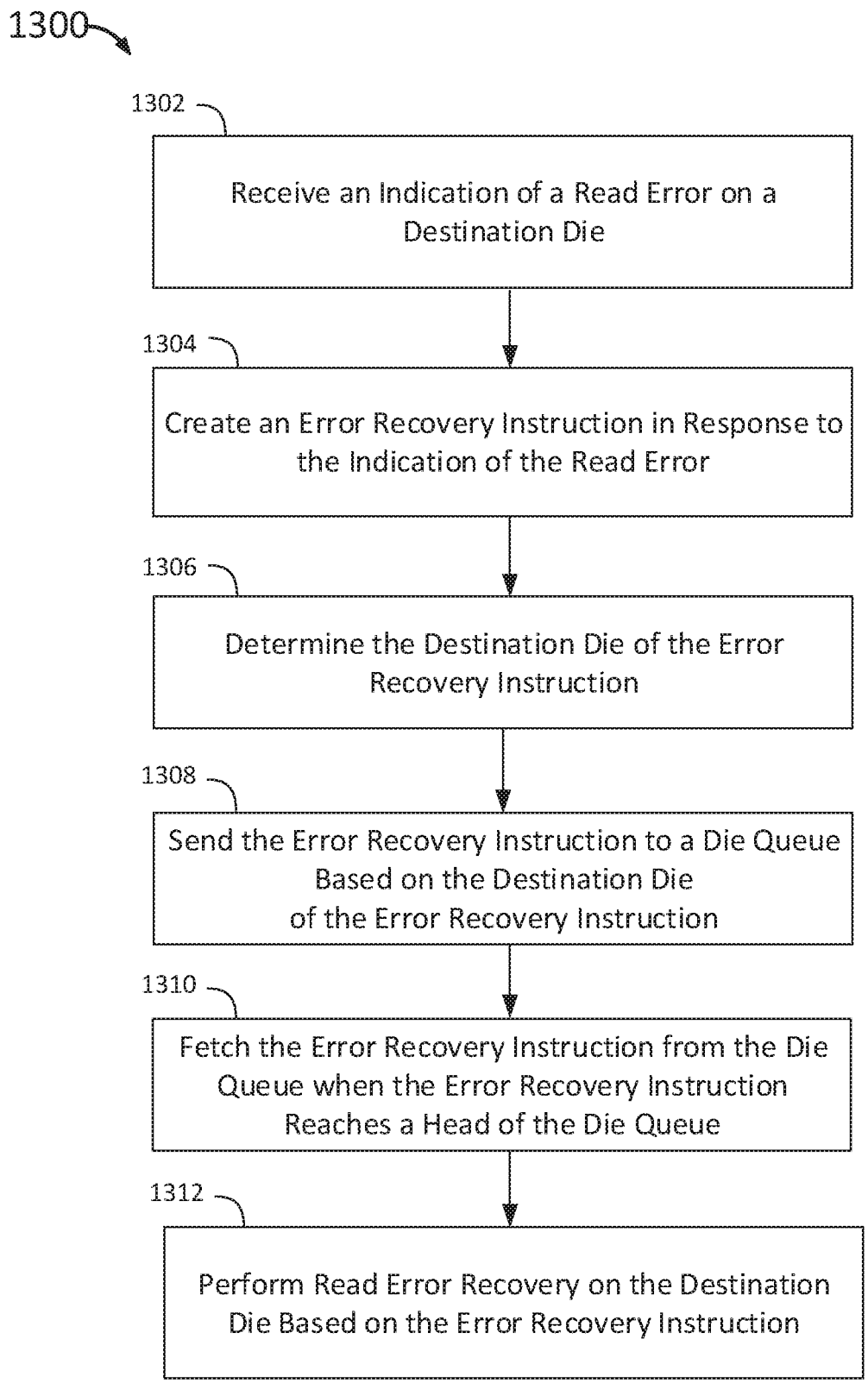
FIG. 13 shows a flow chart of a method for scheduling error recovery messages with die-based queues.

FIG. 13 shows a flow chart of a method 1300 for scheduling error recovery instructions (also referred to as error recovery messages herein) with die-based queues. The scheduling of the error recovery instructions is handled at the flash interface CPU (for example flash interface CPU 119 in FIG. 1, flash interface CPU 219 in FIG. 2, flash interface CPU 319 in FIG. 3, flash interface CPU 619 in FIG. 6, or flash interface CPUs 811 and 813 in FIG. 8). At step 1302, the flash interface CPU receives an indication of a read error on a destination die amongst the memory dies coupled to the flash interface CPU within the memory device. The indication is received in response to an attempted read on a destination die, which failed due to an error. At step 1304, the flash interface CPU creates an error recovery instruction in response to the indication of the read error. The error recovery instruction indicates that an error has occurred, and may also indicate the destination die on which the error occurred and information about what happened in an error on a memory die and how the error can be recovered. In some implementations, the error recovery instruction also includes indications as to the type or severity of the error that occurred.

At step 1306, the flash interface CPU determines the destination die of the error recovery instruction. In some implementations the destination die of the error recovery instruction is the same as the destination die of the failed read command. In some implementations, more than one destination die may be specified. The specifications for the error recovery required by the error recovery instruction may depend on the error recovery algorithm utilized by the SSD and the type or location of the error. In some implementations, the flash interface CPU may also make other determinations based on the error recovery message, for example, the flash interface CPU may determine a priority of the error recovery message, as will be described in FIG. 14 below, or a destination plane of the destination die. The flash interface CPU may use these additional determinations to determine to which die queue, or priority or plane queue within the die queue, the error recovery instruction will be sent. At step 1308, the flash interface CPU sends the error recovery instruction to a die queue based on the destination die of the error recovery message. The error recovery instruction IPC queues at the flash interface CPU include at least one queue per die of the memory device, and the flash interface CPU sends the error recovery instruction to the die queue for the destination die. The error recovery instruction is sent to the tail of the die queue, and moves up through the queue as other instructions are fetched from the head of the queue to form commands for scheduling by the flash interface CPU, and subsequently removed from the queue.

At step 1310, the flash interface CPU fetches the error recovery instruction from the die queue when the error recovery instruction reaches a head of the die queue. The error recovery instruction is then removed from the die queue, and a command is formed and scheduled by the flash interface CPU. The flash interface CPU selects the instruction at the head of each queue in turn according to a scheduling algorithm which determines the selection of the messages and instructions. In some implementations, the scheduling algorithm is a round-robin selection method. At step 1312, the flash interface CPU performs a read error recovery on the destination die based on the error recovery message. The flash interface CPU sends commands to implement the read error recovery to the die. The read error recovery performed is dependent on the type of recovery strategy utilized by the SSD and required by the type of error. In some implementations, the error recovery instruction fetched from the queue causes one or more read commands to be sent to the die. The read commands may include different $V_{th}$ voltage thresholds for a soft-read process, to reattempt the read and recover from the read error. In some implementations, the error recovery instruction fetched from the queue causes a redundancy assisted type recovery from two or more dies, by causing a first read command to be transmitted to a first destination die over a first channel and a second read command to be transmitted to a second destination die over a second channel. In some implementations this is achieved by encoding data in the dies using a Quadruple Swing-By Code (QSBC) error correction code. In some implementations this is achieved by encoding data in the dies using other data redundancy codes, including, but not limited to, RAID codes and erasure codes. Each of the error recovery strategies may be used in combination with one or more of the aforementioned embodiments.

Figure 14:
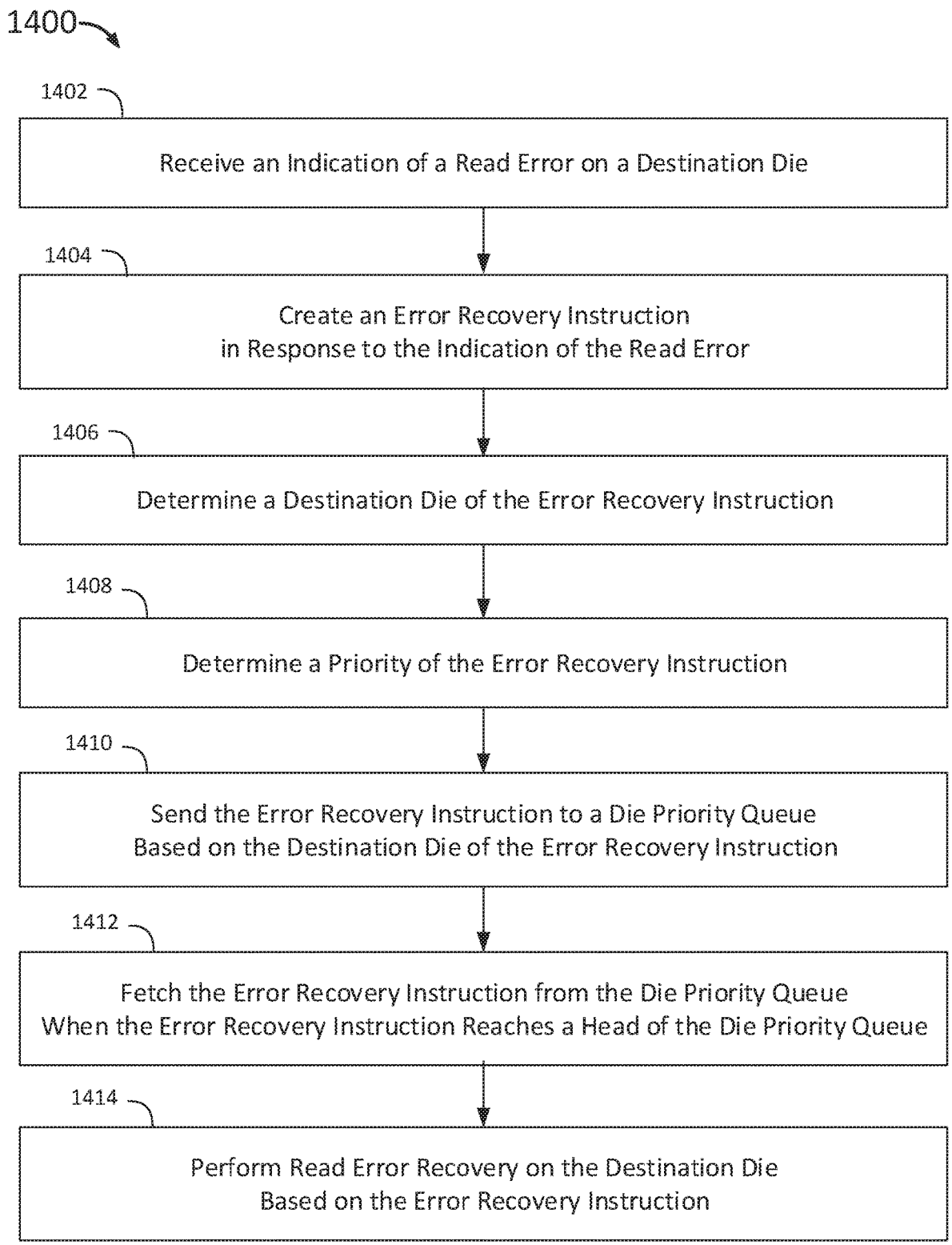
FIG. 14 shows a flow chart of a method for scheduling error recovery messages with die-based queues and priority queues.

FIG. 14 shows a flow chart of a method 1400 for scheduling error recovery instructions with die-based queues and priority queues. As described above in FIG. 13, the scheduling of the error recovery instructions is handled at the flash interface CPU (for example flash interface CPU 119 in FIG. 1, flash interface CPU 219 in FIG. 2, flash interface CPU 319 in FIG. 3, flash interface CPU 619 in FIG. 6, or flash interface CPUs 811 and 813 in FIG. 8). At step 1402, the flash interface CPU receives an indication of a read error on a destination die amongst the memory dies coupled to the flash interface CPU within the memory device. At step 1404, the flash interface CPU creates an error recovery instruction in response to the indication of the read error. At step 1406, the flash interface CPU determines the destination die of the error recovery instruction.

The method of FIG. 14 differs from the method of FIG. 14 in that at step 1408, the flash interface CPU determines a priority of the error recovery message. At step 1410, the flash interface CPU sends the error recovery instruction to a die priority queue based on the destination die of the error recovery instruction and the determined priority. The IPC queues at the flash interface CPU include an error recovery instruction queue for each die of the memory device. Each die queue includes two or more priority queues. This can alternatively be phrased as the error recovery instruction IPC queues at the flash interface CPU including two or more priority queues, each divided into n die queues corresponding to the number n dies coupled to the flash interface CPU. For example, if the memory device includes 32 dies there will be 32 die queues, each separated into high and low priority queues such that there are 64 queues in total. While the priority queues are described as high and low priority queues, there may be further designations of priority such that each die queue includes more than two priority queues.

At step 1412, the flash interface CPU fetches the error recovery instruction from the die priority queue when the error recovery instruction reaches a head of the die priority queue, and forms and schedules one or more commands based on the information contained in the error recovery message. At step 1414, the flash interface CPU performs a read error recovery on the destination die based on the error recovery message.

Figure 15:
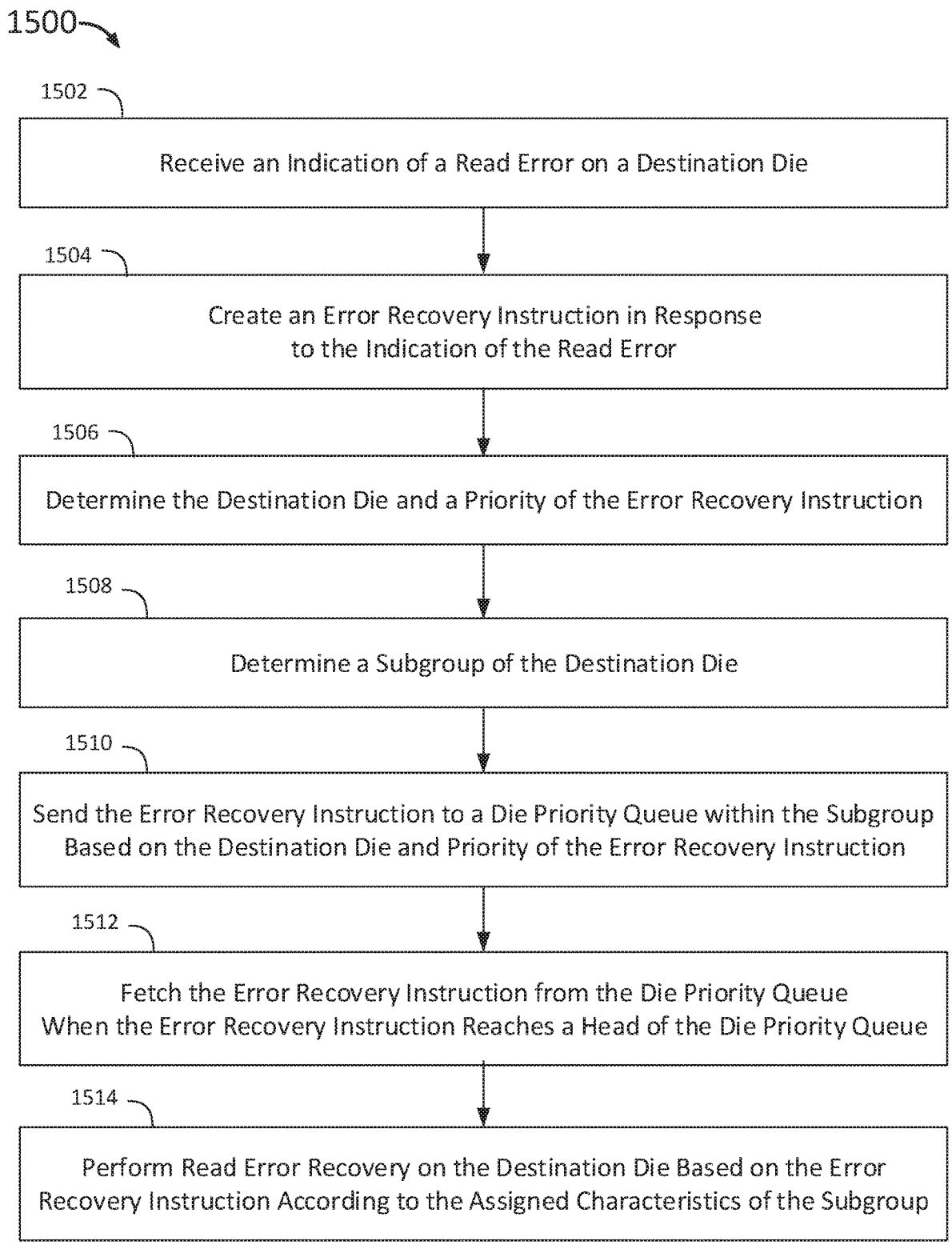
FIG. 15 shows a flow chart of a method for scheduling error recovery messages with die-based queues and priority queues for implementation in IOD Set-enabled and IO Stream-enabled SSDs.

FIG. 15 shows a flow chart of a method 1500 for scheduling error recovery instructions with die-based queues and priority queues for an IOD Set-enabled or IO Stream-enabled SSD. As described above in FIGS. 13 and 14, the scheduling of the error recovery instructions is handled at the flash interface CPU (for example flash interface CPU 119 in FIG. 1, flash interface CPU 219 in FIG. 2, flash interface CPU 319 in FIG. 3, flash interface CPU 619 in FIG. 6, or flash interface CPUs 811 and 813 in FIG. 8). At step 1502, the flash interface CPU receives an indication of a read error on a destination die amongst the memory dies coupled to the flash interface CPU within the memory device. At step 1504, the flash interface CPU creates an error recovery instruction in response to the indication of the read error. At step 1506, the flash interface CPU determines the destination die and priority of the error recovery message. In some implementations, the CPU may make the priority determination based on the type of read command that lead to the error recovery message.

At step 1508, the flash interface CPU determines a subgroup of the destination die of the error recovery message. The IOD Set-enabled or IO Stream-enabled SSD defines a set or stream of dies on the NAND memory device as a group or subgroup, and assigns characteristics to the group such as different scheduling mechanisms, error correction levels, or error recovery requirements to one or more of the sets or streams. In some implementations, each group of dies is assigned at least one of the different scheduling mechanisms, error correction levels, or error recovery requirements. At step 1510, the flash interface CPU sends the error recovery instruction to a die priority subgroup queue based on the destination die of the error recovery message, the determined priority, and the determined subgroup of the destination die. The IPC queues at the flash interface CPU include an error recovery instruction queue for each die of the memory device. Each die queue includes two or more priority queues, and the die queues are further grouped to reflect the assigned subgroups of the SSD. This can alternatively be phrased as the error recovery instruction IPC queues at the flash interface CPU including two or more priority queues, each divided into n×m die queues corresponding to the number n dies per m channels coupled to the flash interface CPU, where the n×m die queues are grouped to reflect the assigned sets or streams. For example, if the memory device includes 32 dies in total there will be 32 die queues, each separated into high and low priority queues such that there are 64 queues in total, with the queues being grouped by sub-group for ease of processing by the CPU, or where different sub-groups can have different error recovery mechanisms. While the priority queues are described as high and low priority queues, there may be further designations of p priority levels such that each die queue includes more than two priority queues.

At step 1512, the flash interface CPU fetches the error recovery instruction from the die priority queue when the error recovery instruction reaches a head of the die priority queue. The flash interface CPU forms one or more commands for scheduling, where the commands formed are based on the characteristics assigned to the subgroup, and in some implementations also on information and instructions in the fetched error recovery message. At step 1514, the flash interface CPU performs a read error recovery on the destination die based on the error recovery instruction and the characteristics assigned to the subgroup.

Sending the error recovery instruction to a queue specific to the destination die and priority of the error recovery instruction improves the efficiency of instruction scheduling and error recovery. The die-based and priority-based error recovery queues reduce the likelihood that a high-priority instruction will be placed in the queue behind a low-priority message, and improves the latency of the scheduling system. The die-and-priority-based optimized handling of read error recovery instructions reduces the total firmware overhead during error recovery, and the flash interface CPU is able to more flexibly schedule error recovery instructions while also processing and scheduling other commands, messages, and instructions.

Further, the die-based error recovery message queues can be easily scaled to improve error handling on various NAND architectures, such as IOD Set-enabled and IO Stream-enabled SSD architectures, described above in FIGS. 8-12. IOD Set-enabled and IO Stream-enabled SSD architectures define subgroups of dies on the SSD which can be assigned different tasks or characteristics depending on user requirements. The subgroups of dies can be assigned different scheduling mechanisms, error correction levels, or error recovery requirements to support the user requirements, and by grouping error recovery instruction priority die queues according to the subgroup, the CPU can utilize the assigned characteristics of the group to schedule the instructions or perform data and error recovery. The improved flexibility of the CPU in scheduling and performing error recovery with the introduction of subgroups allowed by IOD Set-enabled and IO Stream-enabled SSDs increases efficiency of the CPU, reduces overhead during error recovery, and reduces latency for optimized handling of read errors.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

What is claimed is:

1. A method of scheduling error recovery instructions by a processor communicatively coupled to a NAND memory device comprising an n×m array of NAND memory dies having n channels, each channel of the n channels being communicatively coupled to m NAND memory dies to form n×m die queues each comprising p die priority queues, each NAND memory die of the n×m array is assigned to one of at least two groups, and the die priority queues are grouped to correspond to the at least two groups to which the n×m array of NAND memory dies are assigned, the method comprising:
   receiving an indication of a read error responsive to an attempted execution of a read command on a destination die of the n×m array of NAND memory dies;
   creating an error recovery instruction in response to the indication of the read error;
   determining the destination die of the n×m array of NAND memory dies to which the read command is directed and a priority of the error recovery instruction; and
   sending the error recovery instruction to a die priority queue corresponding to the determined destination die and the priority of the error recovery instruction.

2. The method of claim 1, wherein a first group of the at least two groups comprising one of Input Output Determinism (IOD) sets or Input Output (IO) streams, the method further comprising:
   fetching the error recovery instruction from a die priority queue in the first group of the at least two groups based on a selection method assigned to the first group; and
   performing read error recovery at the destination die by applying a read error recovery mechanism associated with the first group.

3. The method of claim 2, further comprising:
   assigning a first priority to a first subset of the n×m array of NAND memory dies; or
   assigning a second priority to a second subset of the n×m array of NAND memory dies.

4. The method of claim 3, further comprising:
   determining whether the destination die is part of the first subset or the second subset; and
   applying a scheduling mechanism from a predetermined number of scheduling mechanisms based on the determination.

5. The method of claim 1, further comprising:
   determining the priority associated with the error recovery instruction; and
   sending the error recovery instruction to the die priority queue with the determined priority.

6. The method of claim 5, wherein determining the priority associated with the error recovery instruction further comprises determining the error recovery instruction is one of a low priority message and a high priority message.

7. The method of claim 6, wherein determining the priority includes determining a type of failed read command associated with the error recovery instruction.

8. The method of claim 1, further comprising:
   fetching the error recovery instruction from the die priority queue based on a selection method; and
   performing read error recovery on the destination die.

9. The method of claim 8, wherein the selection method comprises a round-robin method when the error recovery instruction is at a head of the die priority queue.

10. The method of claim 8, wherein performing read error recovery on the destination die further comprises:
    processing the fetched error recovery instruction from a first die priority queue, wherein the first die priority queue corresponds to a first priority of the p priorities of a first die of the m dies and a first channel of the n channels; and
    transmitting a first read command to the destination die over the first channel of the n channels to the first die of the m dies.

11. The method of claim 8, further comprising performing a second read error recovery on a second destination die by:
    processing a second error recovery instruction from a second die priority queue, wherein the second die priority queue corresponds to a second priority of the p priorities of the first of the m dies and a second channel of the n channels; and transmitting a second read command to the second destination die over a second channel of the n channels, the second read error recovery performed in parallel with the read error recovery.

12. A system for scheduling error recovery instructions at a processor, the system comprising:
a NAND memory device comprising an n×m array of NAND memory dies having n channels, wherein each channel of the n channels is communicatively coupled to m NAND memory dies; and
a processor communicatively coupled to the NAND memory device, the processor comprising:
logic configured to process read commands requesting data from the NAND memory device and error recovery instructions for execution on the NAND memory device; and
a die queue for each NAND memory die of the n×m array, each die queue comprising p die priority queues, each NAND memory die of the n×m array is assigned to one of at least two groups, and the die priority queues are grouped to correspond to the at least two groups to which the n×m array of NAND memory dies are assigned;
the processor configured to:
receive an indication of a read error responsive to an attempted execution of a read command on a destination die of the n×m array of NAND memory dies;
create an error recovery instruction in response to the indication of the error;
determine the destination die of the n×m array of NAND memory dies to which the error recovery instruction is directed and a priority of the error recovery instruction; and
send the error recovery instruction to a die queue corresponding to the determined destination die and the priority of the error recovery instruction.

13. The system of claim 12, wherein a first group of the at least two groups comprises one of Input Output Determinism (IOD) sets or Input Output (IO) streams, and the processor is further configured to:
fetch the error recovery message from a die priority queue in a first group of the at least two groups based on a selection method assigned to the first group; and
perform read error recovery at the destination die by applying a read error recovery mechanism associated with the first group.

14. The system of claim 12, wherein the processor is further configured to:
determine the priority associated with the error recovery instruction; and
send the error recovery instruction to a die priority queue within the determined priority.

15. The system of claim 14, wherein the processor is further configured to determine the priority associated with the error recovery instruction by determining the error recovery instruction is one of a low priority message and a high priority message.

16. The system of claim 15, wherein the processor is further configured to determine the priority by determining a type of failed read command associated with the error recovery instruction.

17. The system of claim 14, wherein the processor is further configured to determine the priority associated with the error recovery instruction by determining a priority assignment of the destination die.

18. The system of claim 17, wherein the processor is further configured to:
assign a first priority to a first subset of the n×m array of NAND memory dies or assign a second priority to a second subset of the n×m array of NAND memory dies;
determine whether the destination die is part of the first subset or the second subset; and
apply a scheduling mechanism from a predetermined number of scheduling mechanisms based on the determination.

19. The system of claim 14, wherein the processor is further configured to:
fetch the error recovery instruction from the die priority queue based on a selection method when the error recovery instruction is at a head of the die priority queue; and
perform read error recovery on the destination die.

* * * * *